United States Patent [19]

Karaki et al.

[11] Patent Number: 4,942,584
[45] Date of Patent: Jul. 17, 1990

[54] SEMICONDUCTOR LASER APPARATUS DRIVING SYSTEM

[76] Inventors: Morihiro Karaki; Masahisa Shinoda; Yasuyuki Satou, c/o Mitsubishi Denki Kabushiki Kaisha Denshi Shohin Kaihatsu Kenkyusho 1 Babazusho, Nagaokakyo-shi, Japan

[21] Appl. No.: 368,034

[22] Filed: Jun. 16, 1989

[30] Foreign Application Priority Data

Jun. 22, 1988 [JP] Japan .................................. 63-152423
Jun. 28, 1988 [JP] Japan .................................. 63-158070
Jul. 12, 1988 [JP] Japan .................................. 63-171965
Aug. 3, 1988 [JP] Japan .................................. 63-192669

[51] Int. Cl.$^5$ ............................................. H01S 3/10
[52] U.S. Cl. ........................................ 372/29; 372/31; 372/38
[58] Field of Search .............................. 372/38, 29, 31

[56] References Cited
U.S. PATENT DOCUMENTS
4,819,242 4/1989 Kaku et al. .......................... 372/38

FOREIGN PATENT DOCUMENTS
60-263349 12/1985 Japan .

OTHER PUBLICATIONS
Principles of Optical Disc Systems, Philips Research Laboratories, Eindhoven, Adam Hilger Ltd., Bristol and Boston, G. Bouwhuis, et al, 1985.

Primary Examiner—James W. Davie
Attorney, Agent, or Firm—Morrison Law Firm

[57] ABSTRACT

In a semiconductor laser apparatus driving system, forward or/and backward beams from a plurality of semiconductor laser beam sources are detected, and arithmetic operations are provided for the detection outputs to determine the light outputs of the respective ones of the semiconductor laser beam sources. The use of a condenser lens which has been used in conventional system is eliminated and, as a result, precise positioning of such lens is avoided, and the semiconductor laser apparatus driving system can be mass-produced.

15 Claims, 8 Drawing Sheets

SEMICONDUCTOR LASER APPARATUS DRIVING SYSTEM

The present invention relates to a system for driving a semiconductor laser apparatus and, more particularly, to a system for driving a semiconductor laser apparatus which is used as a light source for information recording/reproducing systems for optically recording and reproducing information, and such a system driving, in particular, a semiconductor laser apparatus having a plurality of beam emitting sources.

BACKGROUND OF THE INVENTION

FIG. 1 shows a conventional semiconductor laser apparatus driving system disclosed in for example, the official gazette of Unexamined Japanese Patent Publication No. SHO 60-263349. The driving system comprises a beam emitting section 1 a beam receiving section 2 and a printed circuit board 3. The beam emitting section 1 comprises a metallic base plate 4 on which a header 5 acting as a heat sink is mounted. A semiconductor laser array 6 including two semiconductor laser beam sources is mounted on the planar top surface of the header 5. The metallic base plate 4 has a center aperture 4a therein into which a columnar condenser lens 7 is fitted. Three first stems 8, one of which is not shown, are connected to the respective semiconductor laser beam sources of the semiconductor laser array 6 by connecting lines (not shown). The first stems 8 extend through apertures 9a formed in the base plate 4 and filled with glass filler 9 project from the rear surface of the base plate 4. The first stems 8 are secured to the printed circuit board 3. A package 10 has a center aperture 10a therein which is closed with a glass plate 11 bonded to it. The package 10 is secured to the metallic base plate 4 to cover the header 5. The two semiconductor laser beam sources of the semiconductor laser array 6 emit forward beams 12a and 12b and backward beams 13a and 13b. respectively. The forward beams 12a and 12b are directed onto an information recording medium (not shown) for recording or recovering information. As will be stated later, the backward beams 13a and 13b are used for controlling the forward beams 12a and 12b.

The beam receiving section 2 comprises a pair of photodetectors 15a and 15b embedded in a transparent block 14. Out of opposite ends of the transparent block 14, three second stems 16, one of which is not shown, project. The second stems 16 have their inner ends connected to the photodetectors 15a and 15b within the transparent block 14, and have their outer ends attached to the printed circuit board 3.

The printed circuit board 3 has an aperture 3a extending through it which corresponds to the center aperture 4a in the metallic base plate 4.

The photodetectors 15a and 15b of the beam receiving section 2 are located in a position corresponding to the center aperture 4a in the metallic base plate 4 of the beam emitting section 1 and the aperture 3a in the printed circuit board 3. The backward beams 13a and 13b pass through the columnar condenser lens 7 and are focused onto the photodetectors 15a and 15b, respectively. Thus, the control of the forward beams 12a and 12b can be effected by operating driver circuits (not shown for the respective semiconductor laser beam sources by means of output signals from the photodetectors 15a and 15b receiving the backward beams 13a and 13b.

The conventional semiconductor laser apparatus driving system as above stated needs the condenser lens 7 for condensing the backward beams 13a and 13b to focus on the respective photodetectors 15a and 15b, and it is very difficult to dispose the condenser lens 7 within a small inner space of the package 10, and, therefore, it lacks mass-producibility.

Accordingly, the object of the present invention is to provide a mass-producible semiconductor laser apparatus driving system which is free of the above-stated problem by avoiding positioning of a condenser lens within a limited inner space of a package.

SUMMARY OF THE INVENTION

In a semiconductor laser apparatus driving system according to a first embodiment of the present invention, a photodetector receives backward beams from a plurality of semiconductor laser beam sources together to detect the optical outputs, and only one of a plurality of forward beams is received by a photodetector to detect the optical output. Means is provided to use the thus detected optical outputs for calculating the magnitude of other one of the forward beams. Thus, the magnitudes of the forward beams are controlled in accordance with the separately detected beam magnitudes.

In this system, because the magnitude of a beam from one of a plurality of semiconductor laser beam sources is detected by means of the forward beams, it is not necessary to separately detect the backward beams.

In a semiconductor laser apparatus driving system according to a second embodiment of the present invention, only one of backward beams from a plurality of semiconductor laser beam sources is separately received by a first photodetector to detect the magnitude, and the forward beams from the semiconductor laser beam sources are received together by a second photodetector to detect the magnitude of the forward beams. Means is provided to calculate the magnitude of another one of the backward beams from the outputs of the first and second photodetectors. The magnitudes of the forward beams are controlled in accordance with the separately detected beam magnitudes.

In this second embodiment, because only one of the backward beams from a plurality of semiconductor laser beam sources is independently detected, it is not necessary to separately detect the backward beams.

A semiconductor laser apparatus driving system according to a third embodiment of the present invention includes a halved photodetector which receives portions of respective ones of a plurality of forward beams from a plurality of semiconductor laser beam sources. The optical outputs of the respective semiconductor laser sources are calculated from the output signal of the halved photodetector.

In this third embodiment, the optical outputs of a plurality of semiconductor laser beam sources are detected by an arrangement in which the forward beams from the semiconductor laser beam sources are received together by a halved photodetector and, therefore, it is not necessary to separate the plural beams from each other for detection.

According to a fourth embodiment of the present invention, a semiconductor laser apparatus driving system includes a halved photodetector which receives a plurality of backward beams from a plurality of semiconductor laser beam sources together. The output signal from the halved photodetector is calculated to determine the magnitudes of the respective forward beams from the semiconductor laser beam sources.

According to this fourth embodiment since the optical outputs of a plurality of semiconductor laser beam sources are detected by an arrangement in which a plurality of backward beams from the semiconductor laser beam sources are received collectively by a halved photodetector, it is not necessary to separate the backward beams from each other for detection, and, therefore, it is not necessary to dispose a condenser lens within a package.

According to a fifth embodiment of the present invention, a semiconductor laser apparatus driving system includes photodetectors which receive collectively a plurality of forward and backward beams, respectively, from a plurality of semiconductor laser beam sources. Means is provided for making coincident output signals corresponding to detected forward and backward beams of one of the semiconductor laser beam sources. The optical outputs of the semiconductor laser beams sources are separately determined by calculating from the output signals from the respective photodetectors.

In this fifth embodiment, the detection of the optical outputs of a plurality of semiconductor laser beam sources is effected by photodetectors which detect collectively a plurality of forward beams and a plurality of backward beams, respectively. Accordingly, it is not necessary to separately detect the backward beams.

DETAILED DESCRIPTION OF THE INVENTION

Figure 1:
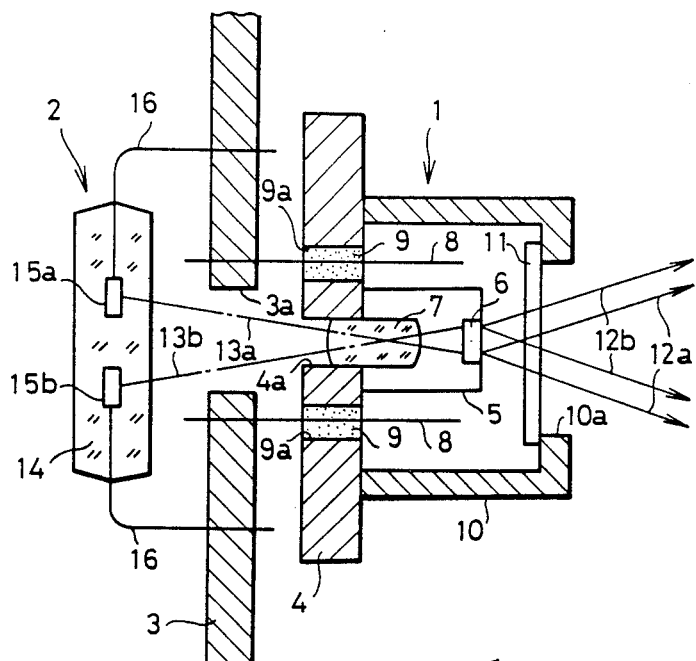
FIG. 1 shows a side cross-sectional view of a conventional semiconductor laser apparatus driving system.
Figure 2:
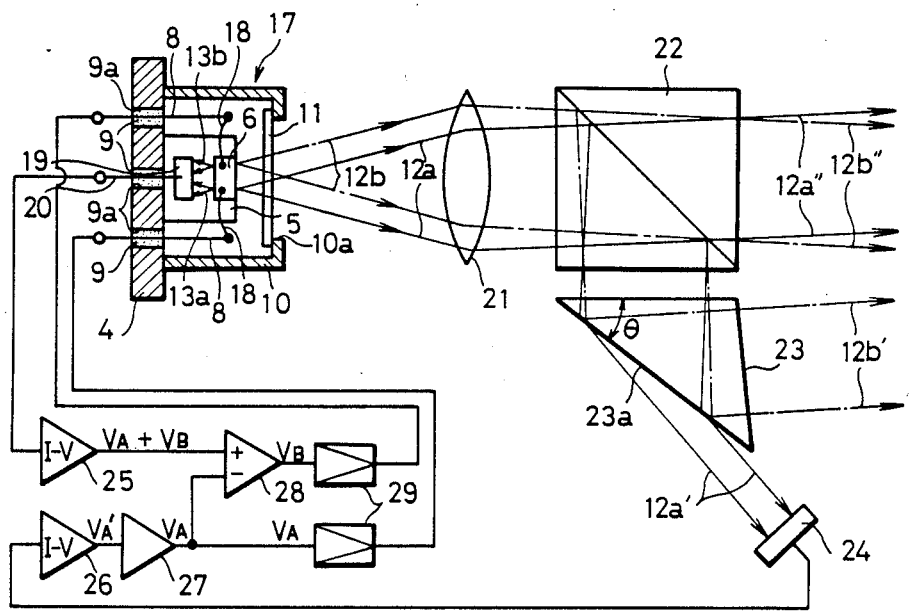
FIG. 2 shows optical paths of a semiconductor laser apparatus driving system according to a first embodiment of the present invention.

FIG. 2 shows a semiconductor laser apparatus driving system according to a first embodiment of the present invention. In FIG. 2, the reference numerals 4, 5, 6, 8, 9, 9a, 10, 10a and 11 attached to the beam emitting section 17 denote components similar or corresponding to the components of FIG. 1 attached with the same reference numerals. Also, forward beams 12a and 12b and backward beams 13a and 13b from a semiconductor laser array 6 are similar to those of FIG. 1. Leads 18 couple currents to independently operate respective ones of a plurality of semiconductor laser beam sources in the array 6. One end of each lead 18 is connected to the semiconductor laser array 6 with the other end connected to a first stem 8. A first photodetector 19 is disposed on a header 5 to receive the backward beams 13a and 13b. A second stem 20 is for deriving out a detection signal from the first photodetector 19 through a lead (not shown). A collimator lens 21 makes the forward beams 12a and 12b into parallel beams. A beam splitter 22 is provided to divide the parallel beams into two portions. The portions 12a'' and 12b'' of the forward beams 12a and 12b passing through the beam splitter 22 are led to an information recording medium (not shown) for recording or reproducing information. On the other hand, the portions 12a' and 12b' of the forward beams 12a and 12b reflected by the beam splitter 22 are caused to be incident on a pyramidal prism 23. The apex angle $\theta$ of the prism 23 is so selected that the angle of incidence of the forward beam portion 12a' onto the inclined surface 23a is smaller than the critical angle and the angle of incidence of the forward beam portion 12b' onto the surface 23a is larger than the critical angle. A second photodetector 24 is disposed to receive the forward beam portion 12a' refracted from the inclined surface 23a. A current-to-voltage converter 25 converts the detection signal (in the form of current) of the first photodetector 19 into voltage. A current-to-voltage converter 26 converts the detection signal from the second photodetector 24 into voltage, which is followed by a voltage adjuster 27 comprising an amplifier or an attenuator. A differential amplifier 28 is connected to the output terminals of the current-to-voltage converter 25 and the voltage adjuster 27. One of two laser driver circuits 29 is connected to the output of the voltage adjuster 27, while the other is connected to the output of the differential amplifier 28. The outputs of the two laser driver circuits are connected to the respective ones of the first stems 8.

In operation, two backward beams 13a and 13b from the semiconductor laser array 6 are both received by the first photodetector 19. Thus, the output of the current-to-voltage converter 25 is the sum of a voltage $V_A$ which is proportional to the magnitude of the forward beam 12a corresponding to the backward beam 13a and a voltage $V_B$ which is proportional to the magnitude of the forward beam 12b corresponding to the backward beam 13b. On the other hand, both of the forward beams 12a and 12b, although partly, are incident onto the pyramidal prism 23 However, because the forward beam portion 12a' is incident onto the inclined surface 23a at an angle smaller than the critical angle, it is refracted at the surface 23a, while the forward beam portion 12b' is totally reflected by the surface 23a since its angle of incidence with respect to the inclined surface 23a is larger than the critical angle. Thus, the second photodetector 24 receives only the forward beam portion 12a' and, therefore the output of the current-to-voltage converter 26 is a voltage $V_A'$ which is proportional to the magnitude of the forward beam 12a. The voltage amplification factor or voltage attenuation factor of the voltage adjuster 27 has been predetermined such that the amplified or attenuated version of the voltage $V_A'$ from the voltage adjuster 27 is equal to the voltage portion $V_A$ corresponding to the forward beam 12a in the output voltage of the current-to-voltage converter 25. The differential amplifier 28 subtracts the output voltage $V_A$ of the voltage adjuster 27 from the output voltage $(V_A+V_B)$ of the current-to-voltage converter 25 to thereby provide the voltage $V_B$ which is proportional to the magnitude of the forward beam 12b. The output $V_A$ from the voltage adjuster 27 and the output $V_B$ from the differential amplifier 28 are applied to the respective ones of the laser driver circuits 29 to independently drive a plurality of semiconductor laser beam sources which emit the forward laser beams 12a and 12b.

The described embodiment has been described to have the second photodetector disposed to receive the forward beam portion 12a' refracted at the inclined surface 23a of the prism 23, but the second photodetector 24 may be disposed to receive the forward beam portion 12b' which is totally reflected from the surface 23a.

In the first embodiment, the voltage adjuster 27 is disposed in the stage following the current-to-voltage converter 26, but it may be disposed in a stage succeeding the other converter 25. Alternatively, each of the current-to-voltage converters 25 and 26 may be followed by a voltage adjuster.

Figure 3:
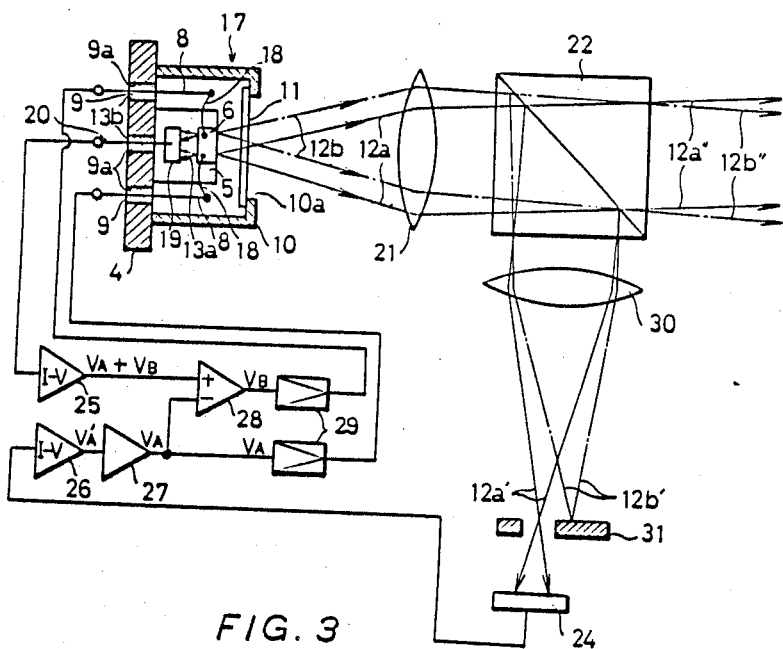
FIG. 3 shows optical paths of a modified version of a semiconductor laser apparatus driving system according to the first embodiment of the present invention shown in FIG. 2.

The system described above employs the pyramidal prism 23 for separating the forward beam portions 12a' and 12b', but any other arrangement such as one shown in FIG. 3 may be used instead. In FIG. 3, the components 5, 6, 8-13, 17-22 and 24-29 are similar to those of FIG. 2. A lens 30 focuses the two parallel forward beam portions 12a' and 12b' reflected from the beam splitter 22. At the position where the forward beam portions are focused by the lens 30, a pin hole structure 31 is disposed which permits only one of the beam portions to pass through it, and there is disposed the second photodetector 24 behind the pin hole structure 31 to receive the beam portion which has passed through the pin hole structure 31.

With this arrangement, since the pin hole structure 31 selects only one of the beam portions of the forward beams 12a and 12b to pass therethrough to the second photodetector 24, the same result can be obtained as in the arrangement of FIG. 2.

Furthermore, in the described embodiment, a plurality of laser beam sources arranged in an array is used, but, in place of the array 6, a hybrid type beam source arrangement which comprises individual beam sources disposed closely adjacent to each other within the same beam emitting section 17 may be used.

Figure 4:
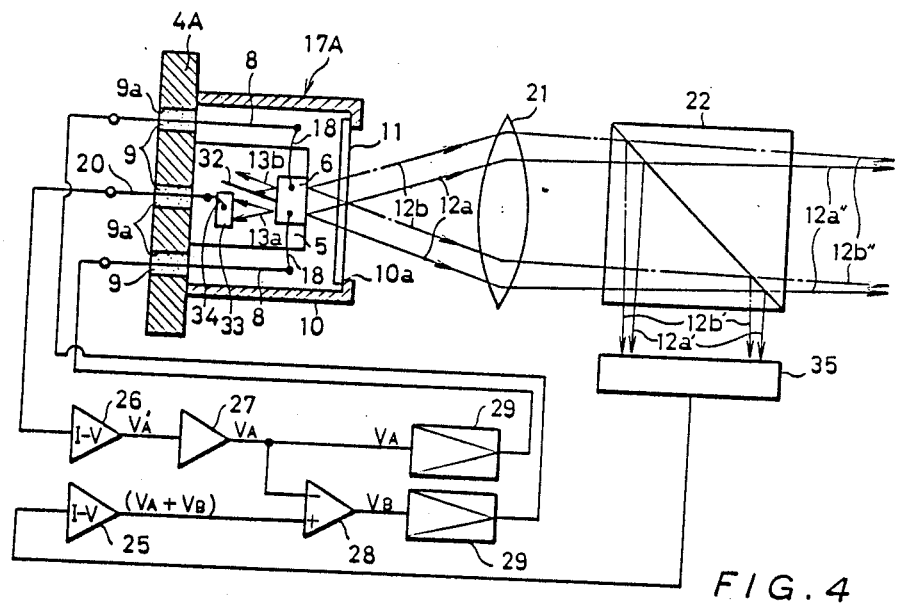
FIG. 4 shows optical paths of a semiconductor laser apparatus driving system according to a second embodiment of the present invention.

FIG. 4 shows a semiconductor laser apparatus driving system according to a second embodiment of the present invention. The components and functions 4, 5, 6, 8, 9, 9a, 10, 10a, 11, 12a, 12a', 12'', 12b, 12b', 12b'', 13a, 13b, 18, 20, 21, 22, 25, 26, 27, 28 and 29 are components or functions similar or equivalent to those which are attached with the same reference numerals in FIG. 2.

A shield plate 32 is disposed behind the semiconductor laser array 6 to prevent the backward beams 13a and 13b from being mixed with each other. A first photodetector 33 is so disposed as to receive only one (13a in FIG. 4) of the backward beams 13a and 13b which are separated by the shield plate 32. An output signal representative of the magnitude of the backward beam 13a is derived out by means of the second stem 20. Those portions 12a'' and 12b'' of the forward beams 12a and 12b which have passed through the beam splitter 22 are led to an information recording medium (not shown) and used to record/reproduce information in or from the recording medium. On the other hand, those portions 12a' and 12b' of the forward beams 12a and 12b which have been reflected from the beam splitter 22 impinge on a second photodetector 35.

In operation, the two backward beams 13a and 13b from the semiconductor laser array 6 are separated from each other by the shield plate 32 so that the first photodetector 33 can receive only one backward beam 13a. Accordingly, the current-to-voltage converter 26 connected to the first photodetector 33 develops a voltage $V_A'$ which is proportional to the magnitude of the received backward beam 13a and, hence, proportional to the magnitude of the forward beam 12a corresponding to the backward beam 13a. On the other hand, the portions 12a' and 12b' of the forward beams 12a and 12b reflected by the beam splitter 22 are received by the second photodetector 35 and, therefore, the output of the current-to-voltage converter 25 connected to the photodetector 35 is the sum of a voltage $V_A$ which is proportional to the magnitude of the forward beam 12a and a voltage $V_B$ which is proportional to the magnitude of the forward beam 12b. That is, the output of the current-to-voltage converter 25 is $V_A+V_B$. The voltage amplification factor or voltage attenuation factor of the voltage adjuster 27 has been predetermined such that the amplified or attenuated version of the output voltage $V_A'$ from the current-to-voltage converter 26 becomes equal to that portion $V_A$ of the output voltage from the current-to-voltage converter 25 which represents the magnitude of the forward beam 12a. The differential amplifier 28 subtracts the output voltage $V_A$ from the voltage adjuster 27 from the output voltage $(V_A+V_B)$ from the current-to-voltage converter 25 to thereby develop the voltage $V_B$ which is proportional to the magnitude of the forward beam 12b. The output $V_A$ from the voltage adjuster 27 and the output $V_B$ from the differential amplifier 28 are applied to the respective ones of the two laser driver circuits 29 to independently drive the semiconductor laser sources which emit the forward beams 12a and 12b.

The second embodiment has been described to use the beam splitter 22 so as to enable the second photodetector 35 to receive the forward beam portions 12a' and 12b'. However, any other suitable arrangement such as one shown in FIG. 5 may be used.

Figure 5:
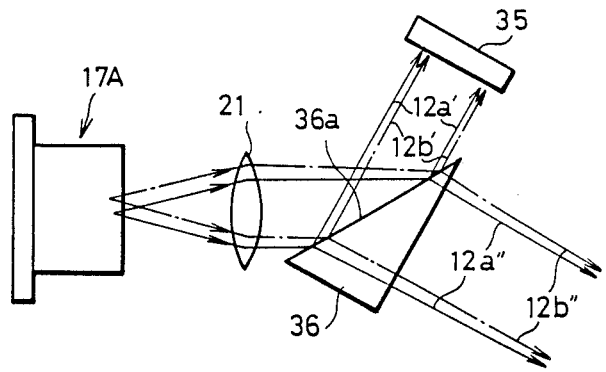
FIG. 5 shows part of the optical paths of a modified version of the semiconductor laser apparatus driving system shown in FIG. 4.

In the arrangement shown in FIG. 5, a beam-shaping prism 36 is disposed in the outlet side of the collimator lens 21 so that portions 12a'' and 12b'' of the forward beams 12a and 12b are refracted to pass through an inclined surface 36a of the prism 36, whereby the semiconductor laser beams which inherently exhibits an elliptic intensity distribution are shaped to exhibit an isotropic intensity distribution. Portions. 12a' and 12b', of the forward beams 12a and 12b are reflected by the surface 36a. By disposing the second photodetector 35 in the direction of reflection from the surface 36a, the forward beam portions 12a' and 12b' are received by the second photodetector 35, so that the same result as in the arrangement shown in FIG. 4 can be obtained.

Figure 6:
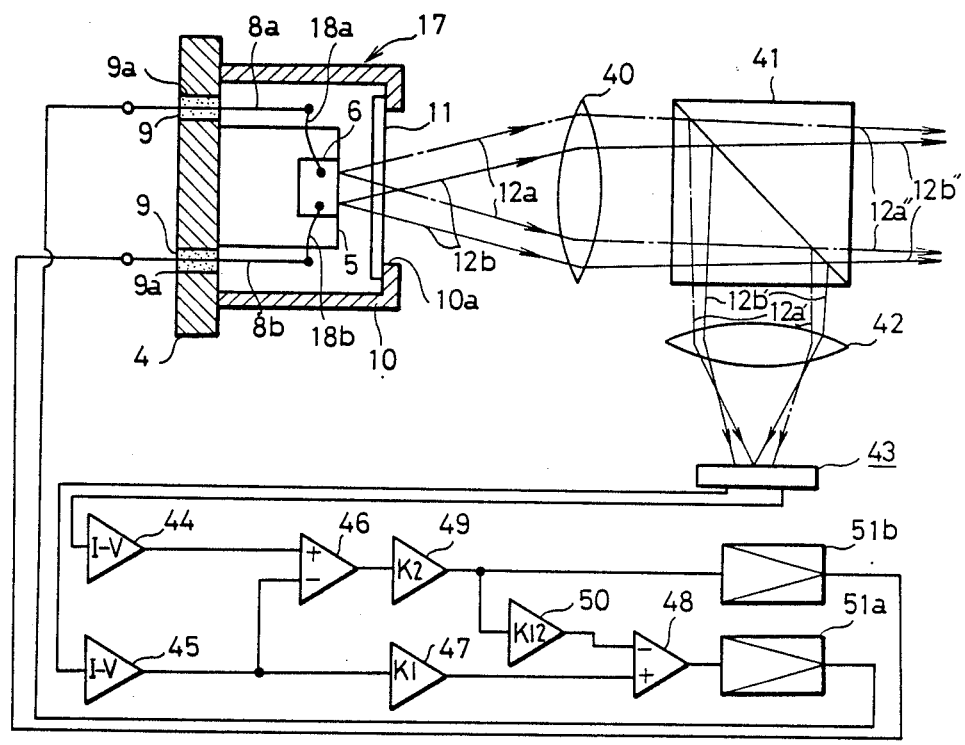
FIG. 6 shows optical paths of a semiconductor laser apparatus driving system according to a third embodiment of the present invention.

FIG. 6 shows a semiconductor laser apparatus driving system according to a third embodiment of the present invention. In FIG. 6, those components and functions associated with the beam emitting section 17 which are attached with the reference numerals 4, 5, 6, 8 (8a, 8b), 9, 9a, 10, 10a, 11, 12a and 12b denote the same components and functions with the same reference numerals shown in FIG. 1. Leads 18a and 18b are used to supply currents for individually operating a plurality of semiconductor laser beam sources in the array 6, and have their respective one ends connected to the array 6 and have their respective other ends connected to the first stems 8a and 8b, respectively. A collimator lens 40 makes the forward beams 12a and 12b parallel. A beam splitter 41 divides the respective forward beams 12a and 12b into two portions. The forward beam portions 12a'' and 12b'' which have passed through the beam splitter 41 are led to an information record medium such as an optical disc record (not shown) for recording or reproducing information from it. On the other hand, the forward beam portions 12a' and 12b' reflected from the beam splitter 41 impinge through a lens 42 onto a halved photodetector 43. Current-to-voltage converters 44 and 45 convert output signals from the halved photodetector 43 into voltage signals. The outputs of the current-to-voltage converters 44 and 45 are coupled to a differential amplifier 46. The output of the converter 45 is also coupled to an amplifier 47 which has its output connected to an addition input terminal of a differential amplifier 4B. An amplifier 49 follows the differential amplifier 46 and has its output terminal connected to an amplifier 50 and a laser driver circuit 51b. The output terminal of the amplifier 50 is connected to a subtraction input terminal of the differential amplifier 48 of which the output terminal is connected to a laser driver circuit 51a. The output terminals of the laser driver circuits 51a and 51b are connected to the stems 8a and 8b, respectively.

Now, the operation of the arrangement of FIG. 6 is explained. The semiconductor laser array 6 comprises a laser beam source LDa connected to the lead 18a and a laser beam source LDb connected to the lead 18b. The light outputs of the laser beam sources LDa and LDb are Pa and Pb, respectively. Now, the operations of the halved photodetector 43 and an arithmetic circuit section for computing the output signals of the halved photodetector 43 are explained with reference to FIG. 7.

Figure 7:
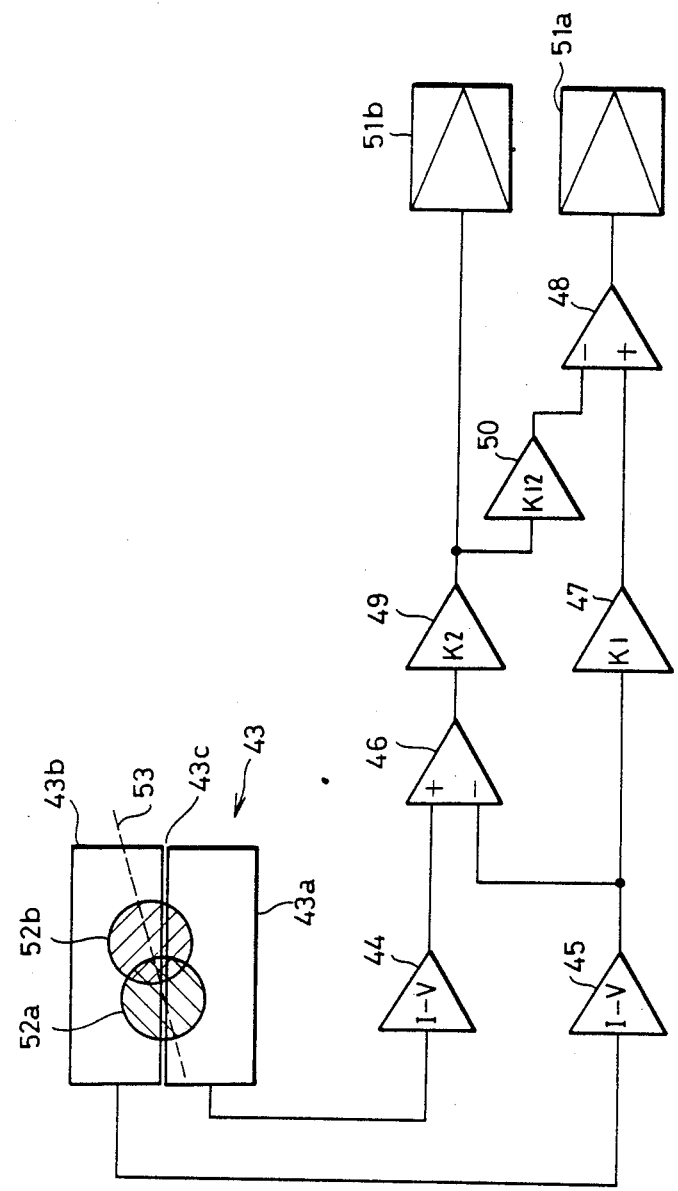
FIG. 7 is a circuit diagram useful in explaining the operation of the system of FIG. 6.

In FIG. 7, a beam spot 52a corresponds to the forward beam 12a from LDa, and a beam spot 52b corresponds to the forward beam 12b from LDb. A broken line 53 is a line connecting the centers of the spots 52a and 52b and is at a certain angle with a halving line 43c between light receiving surfaces 43a and 43b of the photodetector 43. Let it be assumed that the power transmission factors of the forward beam 12a from LDa to the light receiving surfaces 43a and 43b are Ta$_1$ and Ta$_2$, respectively, and the power transmission factors of the forward beam 12b from LDb to the light receiving surfaces 43a and 43b are Tb$_1$ and Tb$_2$, where $0 <$ Ta$_1$, Ta$_2$, Tb$_1$, Tb$_2 < 1$.

When LDa and LDb are emitting laser beams with the light outputs of Pa and Pb, respectively, output voltage signals P$_1$ and P$_2$ of the current-to-voltage converters 44 and 45, respectively, can be generally expressed as follows.

$$P_1 = (Ta_1 \cdot Pa + Tb_1 \cdot Pb) \cdot K\alpha \cdot K\beta a \quad (1)$$

$$P_2 = (Ta_2 \cdot Pa + Tb_2 \cdot Pb) \cdot K\alpha \cdot K\beta b \quad (2)$$

In the equations (1) and (2), $K\alpha$ is a light-to-current conversion efficiency, and $K\beta a$ and $K\beta b$ are current-to-voltage conversion efficiencies of the current-to-voltage converters 44 and 45, respectively. Input light signals P$_1$' and P$_2$' at the photodetector light receiving surfaces 43a and 43b are expressed as follows.

$$P_1' = P_1 / K\alpha \cdot K\beta a \quad (3)$$

$$P_2' = P_2 / K\alpha \cdot K\beta b \quad (4)$$

The substitution of the equations (3) and (4) into the equations (1) and (2) results:

$$P_1' = Ta_1 \cdot Pa + Tb_1 \cdot Pb \quad (5)$$

$$P_2' = Ta_2 \cdot Pa + Tb_2 \cdot Pb \quad (6)$$

It has been so arranged that $K\beta a$ and $K\beta b$ in the equations (3) and (4) are equal to each other and to $K\beta$ and that Ta$_1$ and Ta$_2$ in the equations (5) and (6) are equal to each other. The arithmetic operation of (5)–(6) results the following.

$$\begin{aligned} P_1' - P_2' &= (Tb_1 - Tb_2) \cdot Pb \\ Pb &= (P_1' - P_2')/(Tb_1 - Tb_2) \\ &= K_2 \cdot (P_1 - P_2) \end{aligned} \quad (7)$$

where $K_2 = [1/(Tb_1 - Tb_2)] \cdot (1/K\alpha \cdot K\beta)$ (8)

Thus, it is seen that the light output Pb of LDb can be known as the product of the constant K$_2$ by the difference between the output signal P$_1$ of the current-to-voltage converter 44 and the output signal P$_2$ of the current-to-voltage converter 45. Thus, regardless of the light output Pa of LDa, the light output Pb of LDb can be detected, and it can be controlled to be at a desired value by means of the laser driver circuit 51b.

From the equations (7) and (2)

$$Pa = (1/Ta_2)P_2' - (Tb_2/Ta_2)Pb = K_1 \cdot P_2 - K_{12} \cdot Pb \quad (9)$$

where $$K_1 = (1/Ta_2) \cdot (1/K\alpha \cdot K\beta) \quad (10),$$

and $$K_{12} = Tb_2/Ta_2 \quad (11)$$

Thus, the light output Pa of LDa can be calculated by means of the constants K$_1$ and K$_{12}$, the output signal Pb of the amplifier 49 and the output signal P$_2$ of the current-to-voltage converter 45. Accordingly, it is arranged that the amplification factors K$_1$ and K$_{12}$ of the respective amplifiers 47 and 50 have the values expressed by the equations (10) and (11), respectively. The differential amplifier 4B performs necessary arithmetic to determine the output Pa of LDa. Thus, the light output Pa of LDa can he controlled to be at a desired value by the laser driver circuit 51a.

As stated above with this arrangement, the light outputs of the laser beam sources LDa and LDb in the semiconductor laser array 6 can be individually detected and controlled.

In the above-stated embodiment, it is assumed that $$Ta_1 = Ta_2 \text{ and } Tb_1 \neq Tb_2.$$

However, it can be that $$Ta_1 \neq Ta_2 \text{ and } Tb_1 \neq Tb_2 \quad (12)$$

or, $$Ta_1 \neq Ta_2 \text{ and } Tb_1 = Tb_2 \quad (13).$$

What is necessary is, $$Ta_2/Ta_1 \neq Tb_2/Tb_1 \quad (14)$$

Under the condition expressed by the equation (12) or (13) the current-to-voltage conversion efficiencies $K\beta a$ and $K\beta b$ of the respective current-to-voltage converters 44 and 45 are so selected as to fulfill the following equation (15).

$$Ta_1 \cdot K\beta a = Ta_2 \cdot K\beta b \quad (15)$$

Alternatively, $K\beta a$ and $K\beta b$ are set to be equal and an amplifier with an amplification factor $K_0$ is disposed between the current-to-voltage converter 44 and the amplifier 46, in which $K_0$ is selected to fulfill the following equation (16).

$$Ta_1 \cdot K_0 = Ta_2 \quad (16)$$

The third embodiment of the present invention thus far described employs a plurality of semiconductor laser beam sources arranged in an array. However, the present invention is also useful for a system which employs a hybrid-type laser beam source arrangement comprising individual beam sources disposed close to each other within the same beam emitting section 17.

Figure 8:
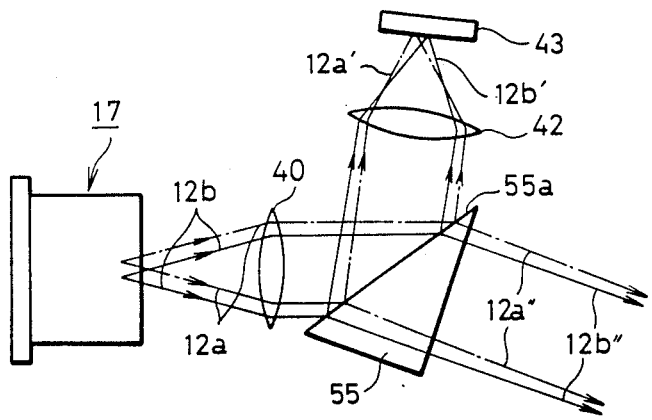
FIGS. 8 and 9 show parts of optical paths of different modified versions of the system shown in FIG. 6.
Figure 9:
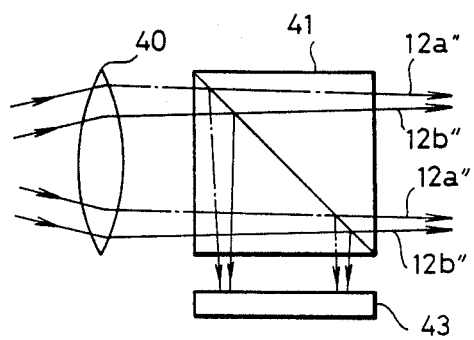

Furthermore, instead of using the beam splitter 41 for providing the forward beam portions 12a' and 12b' to be received by the halved photodetector 43 in this embodiment, an arrangement shown in FIG. 8 may be used.

In FIG. 8, the beam emitting section 17, the collimator lens 40, the forward beams 12a and 12b, the lens 42, and the halved photodetector 43 are the same as those of FIG. 6. A beam shaping prism 55 disposed in the outlet side of the collimator lens 40 has an inclined surface 55a which refracts portions 12a'' and 12b'' of the forward beams 12a and 12b to pass through the prism 55 so that the intensity distribution of the semiconductor laser beam which is inherently elliptic is changed into an isotropic intensity distribution. There are some portions which are not refracted at the surface 55a but are reflected from the surface 55a. The lens 42 and the halved photodetector 43 are disposed in this order so that the photodetector 43 can receive the reflected forward beam portions 12a' and 12b', and the same result as in the arrangement of FIG. 6 can be obtained.

In the above-stated third embodiment, the beam portions incident on the halved photodetector 43 are focused by means of the lens 42, but the lens 42 may be omitted and the parallel beam portions may be caused to be incident on the photodetector 43, as shown in frame 9.

Figure 10:
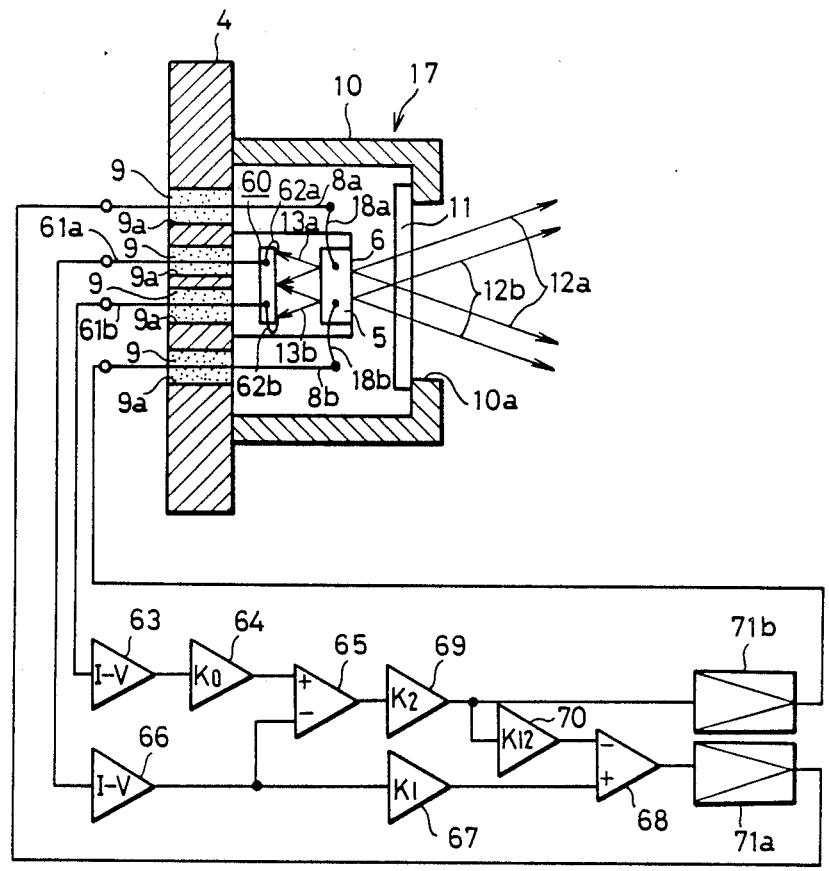
FIG. 10 shows a side cross-sectional view of a semiconductor laser apparatus driving system and its associated circuits according to a fourth embodiment of the present invention.
Figure 11:
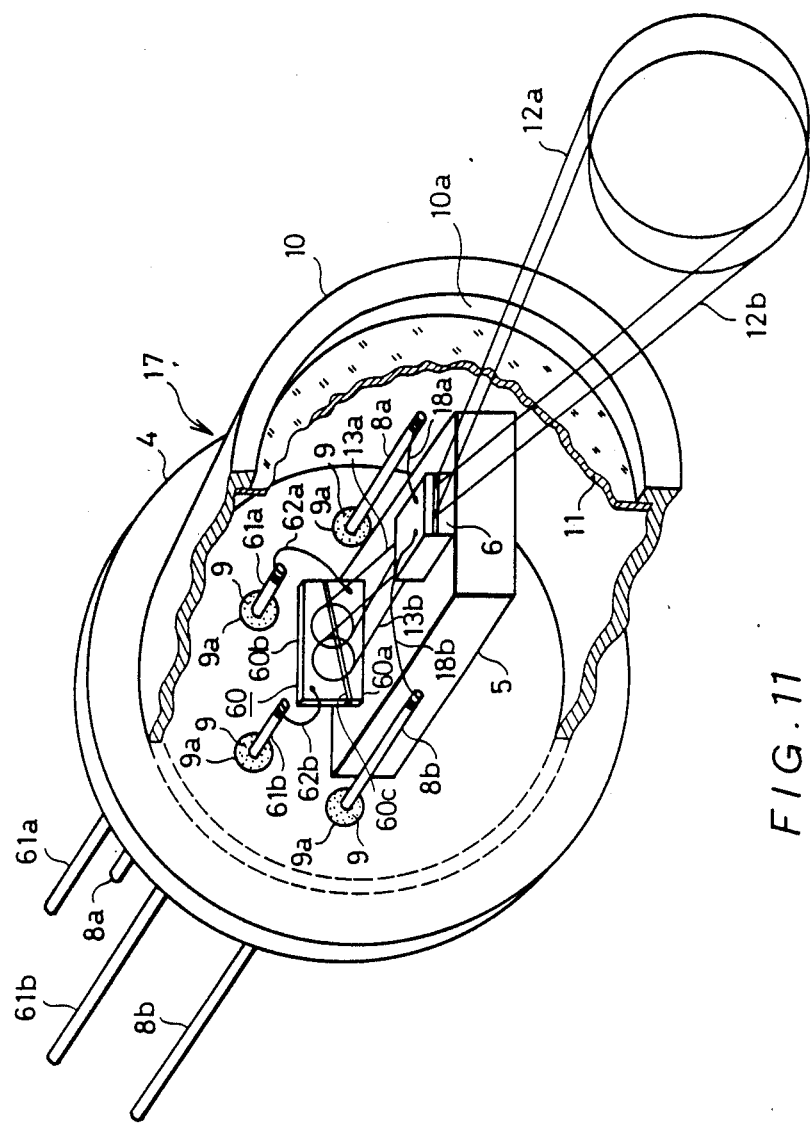
FIG. 11 shows a partially-broken perspective view of a beam emitting section of the system of FIG. 10.

FIGS. 10 and 11 show a semiconductor laser apparatus driving system according to a fourth embodiment of the present invention The components constituting the laser emitting section 17 namely the components 4, 5, 6, 9, 9a, 10, 10a and 11 and the forward and backward beams 12a, 12b and 13a, 13b from the semiconductor laser array 6 are similar or equivalent to those components and beams of FIG. 1 to which the same reference numerals are attached.

Leads 18a and 18b are for supplying currents to individually operate a plurality of semiconductor laser beam sources of the array 6 and have their one ends connected to the array 6 and their other ends connected to respective first stems 8a and 8b. A halved photodetector 60 is disposed on the header 5 in such a manner that it can receive collectively the backward beams 13a and 13b from the laser beam sources. The halved photodetector 60 is connected through leads 62a and 62b to respective second stems 61a and 61b which lead out detection signals from respective light receiving surfaces 60a and 60b of the halved photodetector 60.

The output signal from the light receiving surface 60b of the halved photodetector 60 is derived by the second stem 61b, converted into a voltage signal in a current-to-voltage converter 63, applied to a succeeding amplifier 64, and, then, applied to an addition input terminal of a differential amplifier 65. The output signal from the light receiving surface 60a of the photodetector 60 is derived through another one 61a of the second stems and converted to a voltage signal in a current-to-voltage converter 66. The output of the converter 66 is applied to a subtraction input terminal of the differential amplifier 65 and also to an amplifier 67. The output of the amplifier 67 is coupled to an addition input terminal of a differential amplifier 68. The differential amplifier 65 is followed by an amplifier 69 the output of which is connected to an amplifier 70 and to a laser driver circuit 71b. The output of the amplifier 70 is connected to a subtraction input terminal of the differential amplifier 68 the output of which in turn is connected to a laser driver circuit 71a. The laser driver circuits 71a and 71b are respectively connected to the first stems 8a and 8b.

Figure 12:
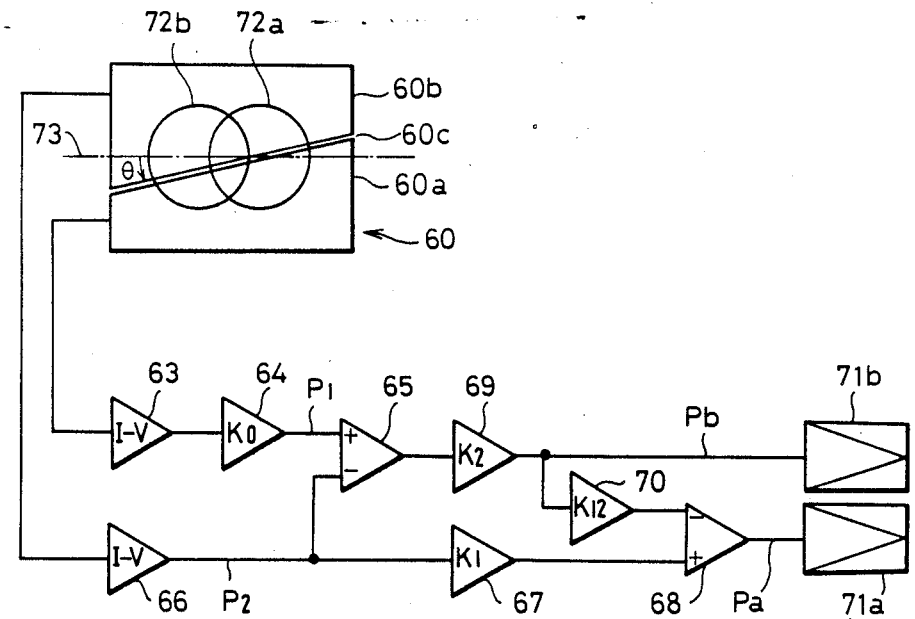
FIG. 12 is a circuit diagram of an output signal calculating circuit of the system shown in FIG. 10.

Now, the operation is explained. The semiconductor laser array 6 includes a laser beam emitting source LDa connected to the lead 18a and a laser beam emitting source LDb connected to the lead 18b. The sources LDa and LDb provide light outputs Pa and Pb, respectively. FIG. 12 is for explaining the operations of the halved photodetector 60 and an arithmetic circuit section for performing necessary arithmetic for the output signals from the photodetector 60. In FIG. 12, a beam spot 72a is formed on the surface of the halved photodetector 60 by the backward beam 13a from the beam emitting source LDa, and a beam spot 72b is formed by the backward beam 13b from the beam emitting source LDb. Let it be assumed that the power transmission factor from the source LDa to the light receiving surface 60a for the backward beam 13a is $Ta_1$, the power transmission from the source LDa to the light receiving surface 60b for the backward beam 13a is $Ta_2$, and the power transmission factors for the backward beam 13b from the beam emitting source LDb to the light receiving surfaces 60a and 60b are $Tb_1$ and $Tb_2$, where $0 < Ta_1, Ta_2, Tb_1, Tb_2 < 1$. A line 73 in FIG. 12 is a line connecting the centers of the beam spots 72a and 72b. The angle $\theta$ ($\theta \neq 0$) of the line 73 with respect to a dividing line 60c of the halved photodetector 60 is determined such that the following equation (20) is established.

$$Ta_2/Ta_1 = Tb_2/Tb_1 \quad (20)$$

Generally, when the beam sources LDa and LDb are emitting beams of the magnitude Pa and Pb, respectively, the following equations are established for output signals $P_1$ and $P_2$ from the amplifier 64 with an amplification factor of $K_0$ ($K_0 > 0$) and the current-to-voltage converter 66.

$$P_1 = K_0 \cdot Ta_1 \cdot Pa + K_0 \cdot Tb_1 \cdot Pb \quad (21)$$

$$P_2 = Ta_2 \cdot Pa + Tb_2 \cdot Pb \quad (22)$$

In the above equations, for example, $Ta_1$ and $Ta_2$ are normally not equal to each other, and, therefore, $$K_0 Ta_1 = Ta_2 \quad (23), \text{ and, hence,}$$

$$K_0 = Ta_2/Ta_1 \quad (24)$$

Accordingly the amplification factor $K_0$ of the amplifier 65 is adjusted such that the equation 23 is established. Then the subtraction of the equation (22) from the equation (21), i.e. (21)–(22), results in:

$$Pb = [1/(K_0 \cdot Tb_1 - Tb_2)](P_1 - P_2) = K_2(P_1 - P_2) \quad (25)$$

where $$K_2 = 1/(K_0 \cdot Tb_1 - Tb_2) \quad (26)$$

Thus, the light output Pb of the beam emitting source LDb can be detected as the product of the constant $K_2$ by the difference between the output signal $P_1$ of the amplifier 64 and the output signal $P_2$ of the current-to-voltage converter 66. Thus, by adjusting the amplification factor $K_2$ of the amplifier 69 to be as expressed by the equation (26), the light output of the source LDb can be detected independently of the light output of the source LDa. Then, the light output of the laser beam emitting source LDb can be controlled to be at a desired fixed value by means of the laser driver circuit 71b.

The substitution of the equation (25) into the equation (22) results in:

$$Pa = (1/Ta_2)P_2 - (Tb_2/Ta_2)Pb = K_1 P_2 - K_{12} Pb \quad (27)$$

where $$K_1 1/Ta_2 \quad (28),$$

and $$K_{12} = Tb_2/Ta_2 \quad (29).$$

The light output Pa of the beam emitting source LDa can be calculated from the constants $K_1$ and $K_{12}$, the output signal Pb of the amplifier 69 and the output signal $P_2$ of the current-to-voltage converter 66. Thus, by adjusting the amplification factors $K_1$ and $K_{12}$ of the amplifiers 67 and 70 such as to establish the equations (28) and (29), respectively the light output of the beam emitting source LDa can be detected and it can be controlled to have a desired fixed value by means of the laser driver circuit 71a.

The above-stated arithmetic enables the individual determination of the light outputs of the beam sources LDa and LDb of the semiconductor laser array 6, and the sources can be driven independently.

In the above-stated example, the line 73 connecting the centers of the beam spots is at an angle $\theta$ with the dividing line 60c of the halved photodetector 60. However, as long as the equation (20) is established, the angle $\theta$ can be zero.

Further, in the above-explained example, a plurality of semiconductor laser beam sources are arranged in an array, but a hybrid-type beam source arrangement comprising individual beam sources arranged close to each other within the same beam emitting section 17 may be used.

Figure 13:
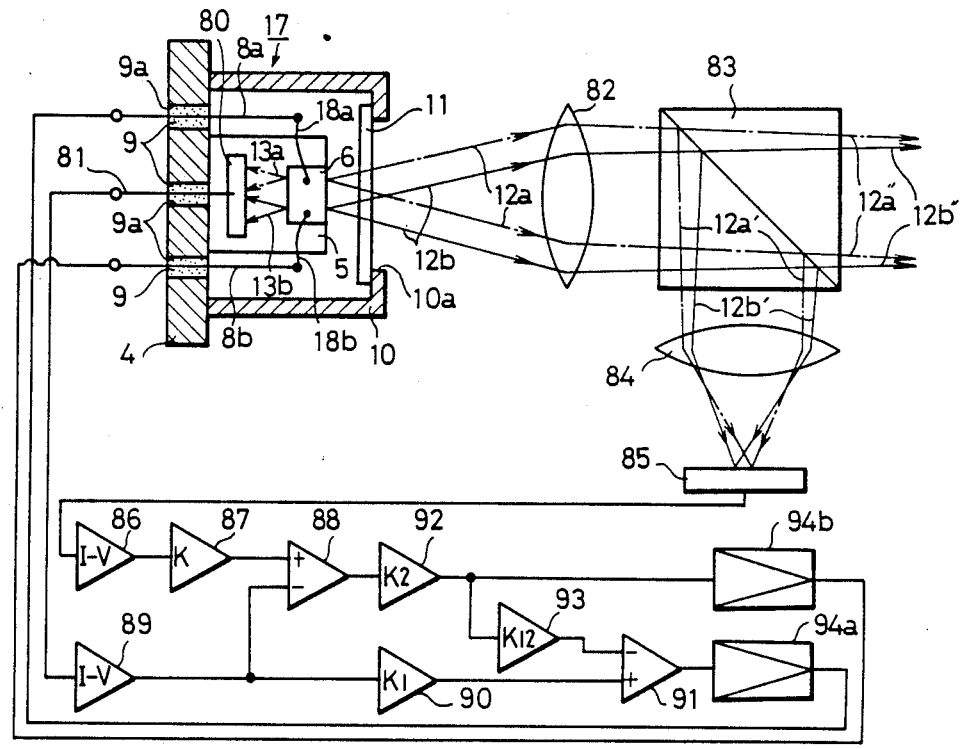
FIG. 13 shows optical paths of a semiconductor laser apparatus according to a fifth embodiment of the present invention.

FIG. 13 shows a semiconductor laser apparatus driving system according to a fifth embodiment of the present invention. In FIG. 13, the components constituting the beam emitting section 17, namely, the components 4, 5, 6, 8a, 8b, 9, 9a, 10, 10a and 11, and the forward and backward beams 12a, 12b and 13a, 13b are similar to or equivalent to those components and functions of FIG. 1 to which the same reference numerals are attached.

Leads 18a and 18b supply currents to respective ones of a plurality of semiconductor laser beam sources in a semiconductor laser array 6 to independently operate them. The respective one ends of the leads 18a and 18b are connected to the array 6 and the other ends are connected to respective ones of first stems 8a and 8b. A first photodetector 80 is disposed on the header 5 so as to receive the backward beams 13a and 13b. A second stem 81 leads out a detection signal of the first photodetector 80 through a lead (not shown). A collimator lens 82 makes the forward beams 12a and 12b parallel. A beam splitter 83 splits each of the parallel beams into two portions. The portions 12a'' and 12b'' of the forward beams 12a and 12b which have passed through the beam splitter 83 are led to an information record medium (not shown) for recording or reproducing information into or from it. The portions 12a' and 12b' of the forward beams 12a and 12b which are reflected from the beam splitter 83 travel through a lens 84 and impinge onto a second photodetector 85. A current-to-voltage converter 86 converts an output signal from the second photodetector 85 into a voltage signal, and is followed by an amplifier 87. The output of the amplifier 87 is connected to an addition input terminal of a differential amplifier 88. A current-to-voltage converter 89 converts an output signal of the first photodetector 80 into a voltage signal. The output of the converter 89 is connected to a subtraction input terminal of the differential amplifier 88 and also to an amplifier 90. The output terminal of the amplifier 90 is coupled to an addition input terminal of a differential amplifier 91. In the stage succeeding the differential amplifier 88, an amplifier 92 is connected of which the output terminal is connected to an amplifier 93 and to a laser driver circuit 94b. The output of the amplifier 93 is connected to a subtraction input terminal of the differential amplifier 91 the output of which is connected to a laser driver circuit 94a. The laser driver circuits 94a and 94b are connected to the first stems 8a and 8b respectively.

Next, the operation of the system with the above-stated arrangement is described. The semiconductor laser array 6 includes a laser beam emitting source LDa connected to the lead 18a and a laser beam emitting source LDb connected to the lead 18b. The respective sources LDa and LDb emit beams with light outputs of Pa and Pb respectively. Let it be assumed that the transmission factor for the forward beam 12a from LDa to the second photodetector 85 is $Ta_1$ ($0 < Ta_1 < 1$). Thus, the output voltage from the current-to-voltage converter 86 is proportional to $Ta_1 Pa$. The output voltage from the amplifier 87 with an amplification factor of k ($k < 0$) is proportional to $k \cdot Ta_1 \cdot Pa$. Similarly, the forward beam 12b from LDb is transmitted to the second photodetector 85 with a transmission factor of $Tb_1$ ($0<Tb_1<1$), so that the output voltage from the amplifier 87 is proportional to $k.Tb_1.Pb$. For the backward beams 13a and 13b, the same analysis can be applied. When the transmission factors for the backward beam 13a from LDa and the backward beam 13b from LDb are $Ta_2$ and $Tb_2$, respectively, and $0<Ta_2<1$ and $0<Tb_2<1$, the outputs from the current-to-voltage converter 89 corresponding to the backward beams 13a and 13b are proportional respectively to $Ta_2.Pa$ and $Tb_2.Pb$. In general, when the sources LDa and LDb are emitting beams with light outputs Pa and Pb respectively an output signal $P_1$ from the amplifier 87 and an output $P_2$ from the current-to-voltage converter 89 are expressed as follows.

$$P_1 = k.Ta_1.Pa + k.Tb_1.Pb \quad (30)$$

$$P_2 = Ta_2.Pa + Tb_2.Pb \quad (31)$$

Normally, for example, $Ta_1$ and $Ta_2$ are not equal to each other, and, therefore, $$k.Ta_1 = Ta_2 \quad (32)$$

or $$k = Ta_2/Ta_1 \quad (33)$$

The amplification factor k of the amplifier 87 is selected to fulfill the equation (33). Then, arithmetic operation of (30)–(31) is performed, which results in:

$$Pb = (1/k.Tb_1 - Tb_2)(P_1 - P_2) = k_2(P_1 - P_2) \quad (34)$$

$$k_2 = (1/k.Tb_1 - Tb_2) \quad (35)$$

Thus, the light output of the beam emitting source LDb is detected as a product of the constant $k_2$ by the difference between the output $P_1$ of the amplifier 87 and the output $P_2$ of the current-to-voltage converter 89. Thus, by setting the amplification factor $k_2$ of the amplifier 92 to have the value expressed by the equation (35), the output of the laser beam emitting source LDb can be detected independently of the output of LDa, and, thus, the light output of the beam emitting source LDb can be controlled to be at a desired fixed value by the laser driver circuit 94b.

The substitution of the equation (34) into the equation (31) results in:

$$Pa = (1/Ta_2)P_2 - (Tb_2/Ta_2)Pb = K_1.P_2 - K_{12}.Pb \quad (36)$$

where $$K_1 = 1/Ta_2 \quad (37),$$

and $$K_{12} = Tb_2/Ta_2 \quad (38)$$

Thus, the light output of LDa can be calculated from the constant $k_1$ and $k_{12}$, the output Pb of the amplifier 92 and the output $P_2$ of the current-to-voltage converter 89. Then by adjusting the amplification factors $k_1$ and $k_{12}$ of the amplifiers 90 and 93 to fulfill the equations (37) and (38) and performing the arithmetic in the differential amplifier 91, the output from LDa can be determined and, thereby, it can be controlled to be at a desired value. Thus, the arithmetic operations described above can determine the light outputs of the laser beam sources LDa and LDb of the semiconductor laser array 6 independently and, therefore it is possible to separately drive the respective beam emitting sources.

In the above-described example, as a plurality of semiconductor laser beam emitting sources, a semiconductor laser array is used, but, alternatively, a hybrid type source arrangement in which individual laser beam sources are disposed close to each other in the same laser beam emitting section 17 may be used.

Figure 14:
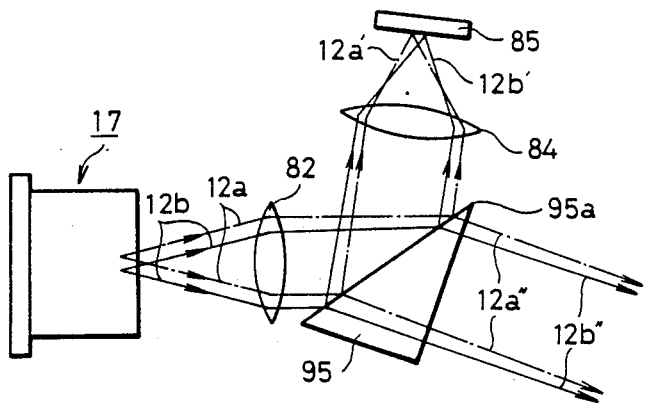
FIG. 14 shows optical paths of a modified version of the system of FIG. 13.

Furthermore, for providing the forward beam portions 12a' and 12b', an arrangement shown in FIG. 14 may be substituted for the beam splitter 83. In FIG. 14, the beam emitting section 17, the collimator lens 84 and the second photodetector 85 are similar to those of FIG. 13. A beam shaping prism 95 is disposed in the beam exit side of the collimator lens 82, and portions of the forward beams 12a and 12b are refracted at an inclined surface 95a of the prism 95 and pass through the prism so that the inherently elliptic intensity distribution of the semiconductor laser beams is modified to an isotropic intensity distribution. At the inclined surface 95a of the beam shaping prism 95, there are portions, other than those refracted ones, of the forward beams reflected from the surface 95a. The lens 84 and the second photodetector 85 are disposed in the named order at a position in the direction of reflection to receive the reflected forward beam portions 12a' and 12b'. Thus, the same result as the one obtained in the arrangement of FIG. 13 can be obtained.

In the above-described example, the lens 84 is used to focus the forward beam portions 12a' and 12b' before they are received by the second photodetector 85, the lens 84 may he omitted so that the forward beam portions 12a' and 12b' impinge on the second photodetector 85, being in the form of parallel beams.

As described in the above, according to the features of the present invention backward beams (or forward beams) from a plurality of semiconductor lasers in a semiconductor laser array are collectively received by a photodetector to determine the magnitude while only one of the forward (or backward) beams is received by a photodetector to determine the magnitude of the received beam, and an arithmetic circuit is used to determine the other of the forward (or backward) beams. Accordingly, it is not necessary to adjust the positioning of the photodetectors and other optical members, and, therefore, the semiconductor laser apparatus driving system of the present invention can be mass-produced.

Furthermore, according to another features of the present invention, a halved photodetector is provided to collectively receive a plurality of forward (or backward) beams from a plurality of semiconductor laser beam emitting sources, means are provided to make coincident those components in the respective output signals from the halved photodetector which are attributable to one of the plurality of semiconductor laser beam emitting sources, and means are provided to calculate the output signals from the two beam receiving surfaces of the halved photodetector, whereby the light outputs of the semiconductor laser beam sources can be independently determined. Accordingly, no optical means for separating a plurality of beams from each other is required and, therefore, otherwise required precise positioning of such optical means is not necessary. Accordingly, the semiconductor laser apparatus driving system of the present invention can be mass-produced.

According to still other feature, photodetectors are provided for collectively receive a plurality of forward beams and a plurality of backward beams which are emitted from a plurality of semiconductor laser beam emitting sources, and means are provided to make coincident those components in the outputs from the photodetectors which are attributable to one of the semiconductor laser beam emitting sources, whereby the light output signals detected by the respective photodetectors are subjected to arithmetic operations to determine the light outputs of of the respective semiconductor laser beam sources independently. Accordingly, no precise positioning of the photodetectors and optical members is necessary, so that the semiconductor laser apparatus driving system according to the present invention can be mass-produced.

What is claimed is:

1. A semiconductor laser apparatus driving system, comprising:
   a semiconductor laser apparatus including a plurality of semiconductor laser beam sources;
   a first photodetector for receiving backward beams from said plurality of semiconductor laser beam sources collectively;
   means for optically separating only one of forward beams from said plurality of semiconductor laser beam sources from said forward beams;
   a second photodetector for receiving said separated one forward beam; and
   means for determining the magnitude of at least one of said forward beams from output signals of said first and second photodetectors.

2. A semiconductor laser apparatus driving system according to claim 1, wherein said means for optically separating comprises a collimator lens, a beam splitter and a pyramidal prism, or comprises a collimator lens, a beam splitter, another lens and a pinhole structure.

3. A semiconductor laser apparatus driving system according to claim 1 or 2, wherein said means for determining comprises current-to-voltage converter means, voltage adjuster means and differential amplifier means.

4. A semiconductor laser apparatus driving system, comprising:
   a semiconductor laser apparatus including a plurality of semiconductor laser beam sources;
   separating means for separating only one of backward beams from said plurality of semiconductor laser beam sources;
   a first photodetector for receiving only said separated one backward beam;
   a collimator lens for forming a plurality of forward beams from said plurality of semiconductor laser beam sources into parallel beams;
   optical means for dividing each of the parallel beams from said collimator lens into two portions in a desired ratio;
   a second photodetector for receiving ones of said two divided portions of respective ones of said parallel beams; and
   means for determining a magnitude of at least one of said plurality backward beams from outputs of said first and second photodetectors.

5. A semiconductor laser apparatus driving system according to claim 4 wherein said separating means comprises a shield plate.

6. A semiconductor laser apparatus driving system according to claim 4 or 5, wherein said optical means for dividing comprises a beam splitter or a beam-shaping prism.

7. A semiconductor laser apparatus driving system according to one of claims 4, 5 and 6, wherein said means for determining comprises current-to-voltage converter means, voltage adjuster means and differential amplifier means.

8. A semiconductor laser apparatus driving system, comprising:
   a semiconductor laser apparatus including a plurality of semiconductor laser beam sources:
   optical means for dividing each of a plurality of forward beams from said plurality of semiconductor laser beam sources into two portions in a desired ratio.
   a halved photodetector for receiving collectively ones of said two divided portions of respective ones of said forward beams;
   means for making coincident the components in the two output signals of said halved photodetector which are attributable to the same one of said plurality of semiconductor laser beam sources; and
   means for determining the respective light outputs of said plurality of semiconductor laser beam sources from the output signals from said halved photodetector.

9. A semiconductor laser apparatus driving system according to claim 8, wherein said optical means comprises a collimator lens, a beam splitter and another lens, comprises a collimator lens and a beam splitter, or comprises a collimator lens, a prism and another lens.

10. A semiconductor laser apparatus driving system according to claim 8 or 9, wherein said means for making coincident and said means for determining comprise current-to-voltage converter means, amplifier means and differential amplifier means.

11. A semiconductor laser apparatus driving system, comprising:
   a semiconductor laser apparatus including a plurality of semiconductor laser beam sources:
   a halved photodetector for receiving collectively a plurality of backward beams from said plurality of semiconductor laser beam sources and for producing two output signals;
   amplifier circuit means for producing an output which is coincident with a magnitude of the forward beam from one of said semiconductor laser beam sources, based on the two output signals from said halved photodetector; and
   means for determining the respective forward beam outputs of said plurality of semiconductor laser beam sources based on the two output signals of said halved photodetectors.

12. A semiconductor laser apparatus driving system according to claim 11 wherein said means for determining comprises differential amplifier means.

13. A semiconductor laser apparatus driving system, comprising:
   a semiconductor laser apparatus including a plurality of semiconductor laser beam sources;
   a first photodetector for receiving collectively a plurality of backward beams from said plurality of semiconductor laser beam sources;
   optical means for dividing each of a plurality of forward beams from said plurality of semiconductor laser beam sources into two portions in a desired ratio;

a second photodetector for receiving collectively ones of said divided two portions of respective ones of said plurality of forward beams;

electric means for making coincident those components in the output signals of said first and second photodetectors which are attributable to the same one of said plurality of semiconductor laser beam sources; and means for determining the light outputs of respective ones of said plurality of semiconductor laser beam sources based on the output signals from said first and second photodetectors.

14. A semiconductor laser apparatus driving system according to claim 13, wherein said optical means comprises a collimator lens, a beam splitter and another lens, comprises a collimator lens and a prism, or comprises a collimator lens and a beam splitter.

15. A semiconductor laser apparatus driving system according to claim 13 or 14, wherein said electric means and said means for determining comprise current-to-voltage converter means, amplifier means and differential amplifier means.

* * * * *